United States Patent
Park

(10) Patent No.: US 7,394,523 B2
(45) Date of Patent: Jul. 1, 2008

(54) EXPOSURE APPARATUS AND METHOD OF CONTROLLING EXPOSURE APPARATUS

(75) Inventor: Seok-Jung Park, Suwon-si (KR)

(73) Assignee: Samsung Electronics co., Ltd., Suwon-si, Gyeonggi-do (KR)

( * ) Notice: Subject to any disclaimer, the term of this patent is extended or adjusted under 35 U.S.C. 154(b) by 539 days.

(21) Appl. No.: 11/184,856

(22) Filed: Jul. 20, 2005

(65) Prior Publication Data

US 2006/0017899 A1    Jan. 26, 2006

(30) Foreign Application Priority Data

Jul. 21, 2004    (KR) .................... 10-2004-0056677

(51) Int. Cl.
G03B 27/52 (2006.01)
G03B 27/42 (2006.01)
G03B 27/32 (2006.01)
G01N 21/86 (2006.01)
G03C 5/00 (2006.01)

(52) U.S. Cl. .................. 355/55; 355/53; 355/77; 250/548; 430/30

(58) Field of Classification Search ............... 355/53, 355/55, 77; 250/548; 430/30
See application file for complete search history.

(56) References Cited

U.S. PATENT DOCUMENTS

| | | | |
|---|---|---|---|
| 5,483,056 A | 1/1996 | Imai | |
| 5,693,439 A * | 12/1997 | Tanaka et al. | 430/30 |
| 5,856,053 A * | 1/1999 | Watanabe | 430/22 |
| 6,608,681 B2 * | 8/2003 | Tanaka et al. | 356/400 |
| 6,894,782 B2 * | 5/2005 | Hoshino et al. | 356/400 |
| 6,975,384 B2 * | 12/2005 | Ina | 355/55 |
| 2004/0013957 A1 | 1/2004 | Hoshino et al. | |

* cited by examiner

*Primary Examiner*—Alan A Mathews
(74) *Attorney, Agent, or Firm*—Volentine & Whitt, PLLC

(57) ABSTRACT

An exposure apparatus generates an interlock signal to stop an exposure process when defocus is detected in real time. Leveling data for at least one wafer, and a predetermined threshold value are stored in a memory of the exposure apparatus. A value indicative of the defocus is calculated from the leveling data. An interlock signal is generated if the result of comparing the defocus value and the threshold value reveals that the focus of a lens of the exposure apparatus is outside an acceptable range.

19 Claims, 6 Drawing Sheets

FIG.1B (PRIOR ART)

| | | | |
|---|---|---|---|
| 11 → [0,0,0] 55<br>12 → [-1,-1,-1]<br>13 → -40,-21<br>14 → 0.10D | [0,0,0] 56<br>[-1,-1,-1]<br>-38,-15<br>-0.04U | [0,0,0] 57<br>[-1,-1,-1]<br>-38,-16<br>0.12D | [0,0,0] 58<br>[-1,-1,-1]<br>-37,-20<br>-0.08U |
| [0,0,0] 48<br>[-1,-1,-1]<br>-35,-19<br>-0.04U | [0,0,0] 47<br>[-1,-1,-1]<br>-37,-15<br>0.13D | [0,0,0] 46<br>[-1,-1,-1]<br>-36,-21<br>-0.06U | [0,0,0] 45<br>[-1,-1,-1]<br>-39,-18<br>0.10D |
| [0,0,0] 37<br>[-1,-1,-1]<br>-37,-17<br>0.10D | [0,0,0] 38<br>[-1,-1,-1]<br>-38,-17<br>-0.08U | [0,0,0] 39<br>[-1,-1,-1]<br>-38,-19<br>0.09D | [0,0,0] 40<br>[-1,-1,-1]<br>-36,-13<br>-0.10U |

EXPOSURE APPARATUS AND METHOD OF CONTROLLING EXPOSURE APPARATUS

BACKGROUND OF THE INVENTION

1. Field of the Invention

The present invention generally relates to a semiconductor manufacturing apparatus. More particularly, the present invention relates to an exposure apparatus of photolithographic equipment.

2. Description of the Related Art

Photolithography is used to form a fine circuit pattern on a wafer. A photolithographic process generally includes cleaning the surface of a wafer, coating the surface with photoresist, aligning the wafer with a mask or reticle, exposing the layer of photoresist to light directed through the mask or reticle, and developing the exposed layer of photoresist. The alignment and exposure processes are carried out using an exposure apparatus.

In addition to a mask or reticle, an exposure apparatus includes a light source, a light measuring device, and a stage on which the wafer is supported. Such exposure apparatus for use in manufacturing a semiconductor device are generally classified as a contact type, a proximity type, or a projection type of exposure apparatus. Projection-type exposure apparatus may further be classified as those comprising an aligner, a stepper, or a scanner. The stepper and scanner each employ a reduction projection type of exposure system, and an aligner employs an iso-magnification projection type of exposure system.

All exposure apparatus must provide a high degree of resolution, and their optics must be able to precisely focus a pattern of light onto a wafer. To this end, a stepper emits light onto a wafer through a reticle while the wafer is stationary. On the other hand, a scanner performs an exposure process while a reticle and a wafer are moving at a uniform speed. Furthermore, the stepper uses refraction optics, whereas the scanner uses reflection optics and a slit. Also, the useful area of the lens in a scanner is very small compared to that of the lens of a stepper. Thus, a scanner is less influenced by aberrations of the lens than a stepper, and a larger numerical aperture (NA) is available in a scanner. Still further, the exposure area is larger in a scanner, which facilitates the reproducibility of the exposure process.

Hence, the current trend is to move away from using a stepper. Instead, exposure apparatus comprising scanners have become more widely used. As chips become larger and semiconductor devices become more highly integrated, the next generation of exposure apparatus will be able to expose wafers over even larger fields.

Nonetheless, an improper calibration of an exposure apparatus or a rapid change in scanning direction may cause a defocus to occur in the exposure process. Such a defocus problem and a conventional method to solve the problem will be described below referring to FIGS. 1A, 1B and 2.

FIG. 1A illustrates an exposure apparatus 10 for use in manufacturing a semiconductor device according to the prior art. FIG. 1B is a table of leveling data generated during an exposure process carried out by the exposure apparatus 10.

Exposure apparatus 10 includes a reticle 1, a light source 2 that emits light through the reticle 1, a reticle stage 3 on which the reticle 1 is mounted, a lens 4 by which light passing through reticle 1 is focused onto a desired portion (shot) of a wafer 5 coated with a layer of photoresist, a level detector 6 for sensing information pertaining to the position/configuration of a surface of the wafer, a wafer stage 8, and a wafer stage position controller 7 to control the position of a wafer stage 8. Leveling data for a wafer is generated by the level sensor 6 during an exposure process, and is discarded after the exposure process.

In FIG. 1B, the squares represent respective shots on a wafer, and the data within each square includes the leveling data measured during the exposure process for the respective shot. Reference numeral 11 indicates data identifying the shot by number. Reference numeral 12 indicates data representative of the relative height of a surface of the wafer for the respective shot. Reference 13 indicates data representative of the degree to which the surface is inclined relative to the horizontal for the respective shot, and reference numeral 14 indicates data representative of the progression of the scan in forward or reverse directions (up or down directions in the figure) and a value representing the degree to which the lens 4 was out of focus prior to exposing the shot (focus error).

That is, to scan the pattern of a reticle onto a respective portion (shot) of the wafer 5, the wafer 5 is scanned by moving the lens 4 in one of two opposite scanning directions referred to hereinafter as downward and upward directions. A scan by the lens 4 in one of the directions will be referred to as a down scan, and a scan by the lens 4 in the other of the directions will be referred to as an up scan. Furthermore, a shot exposed using a down scan of the lens will be referred to as a down scan shot, and a shot exposed using an up scan of the lens 4 will be referred to as an up scan shot. In FIG. 1B reference "U" denotes an up scan shot, and reference "D" denotes a down scan shot.

A critical dimension (CD) of the pattern formed on the wafer 5 is measured to determine whether the circuit pattern on reticle 1 has been properly transferred to the wafer 5. If the pattern formed on the wafer 6 has a CD outside of a desired range, the lens 4 is checked to determine whether it has drifted out of focus.

More specifically, and again referring to FIGS. 1A and 1B, the lens 4 may drift out of focus between an up scan and a down scan. However, it is difficult to determine from the leveling data whether the lens 4 is out of focus. Furthermore, as was mentioned above, the leveling data is temporarily stored in the exposure apparatus 10 and is then discarded. Therefore, the exposure process must be stopped, and a specific leveling qualification test (LQT) must be performed using the leveling data to determine whether the lens 4 is out of focus.

FIG. 2 is a flowchart illustrating an LQT using the leveling data shown in FIG. 1B.

With reference to FIG. 2, a critical dimension (CD) measuring device checks whether the CD of an actual pattern formed on a wafer exceeds the desired or design CD (S21). If the measured CD is acceptable, an exposure process is performed (S27) on the next wafer. However, if the measured CD exceeds a certain value, the exposure process is stopped (S22), and then an LQT using leveling data is executed (S23). The result of the LQT, i.e., the value of the defocus, is outputted to a display device (S24). At this time, if the defocus exceeds a threshold value (S25), the focus of the lens 4 is re-calibrated (S26) and then, the next exposure process is performed (S27). On the other hand, if the value of the defocus is below the threshold value, the next exposure process is performed.

A disadvantage with this method is that the exposure process must be stopped to detect whether the lens is out of focus, and then the level qualification test must be performed. The stopping, the testing, and the re-starting detract from the productivity of the overall process of manufacturing the semiconductor devices.

SUMMARY OF THE INVENTION

Accordingly, an object of the present invention is to provide an exposure apparatus adapted for use in manufacturing a semiconductor device or the like and a method of controlling the same, wherein a state of defocus associated with a lens of the projection system of the apparatus can be confirmed without having to stop the exposure process and conduct a leveling qualification test.

According to one aspect of the present invention, an exposure apparatus includes a light source that emits light used to expose a photoresist on a substrate, a lens by which the emitted light is transmitted to and focused on the substrate, a reticle or mask bearing a pattern an image of which is to be transferred to the substrate, and electronic controls circuit adapted to detect the defocus associated with the lens in real time, i.e., during an exposure process. The electronic controls include a memory for storing a threshold value and leveling data generated by a leveling detector, and an interlock signal generator for calculating a value indicative of the defocus associated with the lens from the leveling data, and for generating an interlock signal if the defocus value reveals that the focus of the lens is outside an acceptable range.

The leveling data includes data representative of errors in the focus of the lens. The interlock generator includes a data processor that calculates the defocus value from the leveling data, a comparator that compares the defocus value with the threshold value during the exposure process, and a signal generator that selectively generates an interlock signal based on the results of the comparison executed by the comparator.

The leveling data may be generated from one or more of the substrates undergoing the exposure process. The exposure process preferably comprises scanning each of several portions (shots) of a substrate to transfer an image corresponding to the pattern of the reticle or mask to the substrate.

In this case, the leveling data includes up scan data representative of errors in the focus of the lens while a substrate is being scanned in a first (an up) direction, and down scan data representative of errors in the focus of the lens while a substrate is being scanned in a second (a down) direction opposite to the first direction. The interlock signal generator is operative to classify such leveling data into the up scan data and the down scan data, and compute the respective mean values of the up scan data and the down scan data. The defocus value is computed as a difference of the mean values.

The leveling data may also include height data representative of the relative height of a surface of the substrate during an exposure process, and inclination data representative of the degree to which a surface of the substrate is inclined relative to the horizontal during an exposure process.

BRIEF DESCRIPTION OF THE DRAWINGS

These and other objects, features and advantages of the present invention will be better understood from the following detailed description of the preferred embodiments thereof made with reference to the accompanying drawings, wherein:

FIG. 1B is a table of leveling data measured during an exposure process performed by the exposure apparatus of FIG. 1A;

DETAILED DESCRIPTION OF THE PREFERRED EMBODIMENTS

Figure 3:
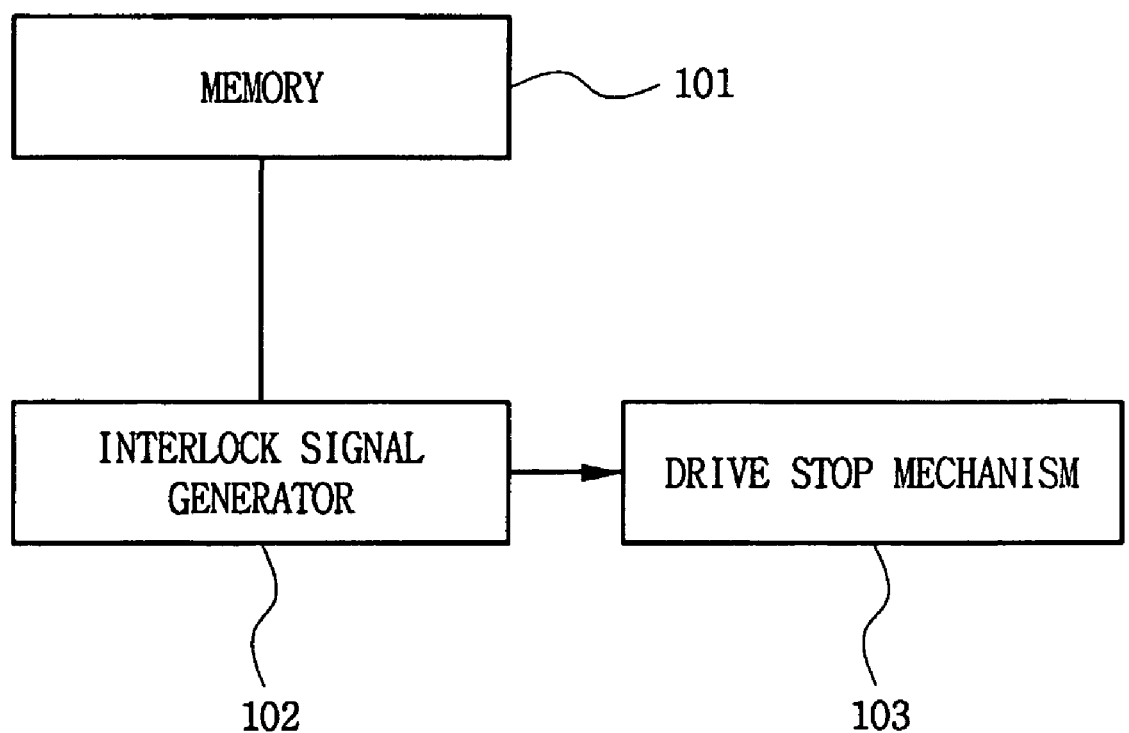
FIG. 3 is a block diagram of electronic controls in an exposure apparatus according to the present invention.

Referring now to FIG. 3, an exposure apparatus according to the present invention includes a memory 101 for storing data, an interlock signal generator 102, and a drive control mechanism 103.

Figure 2:
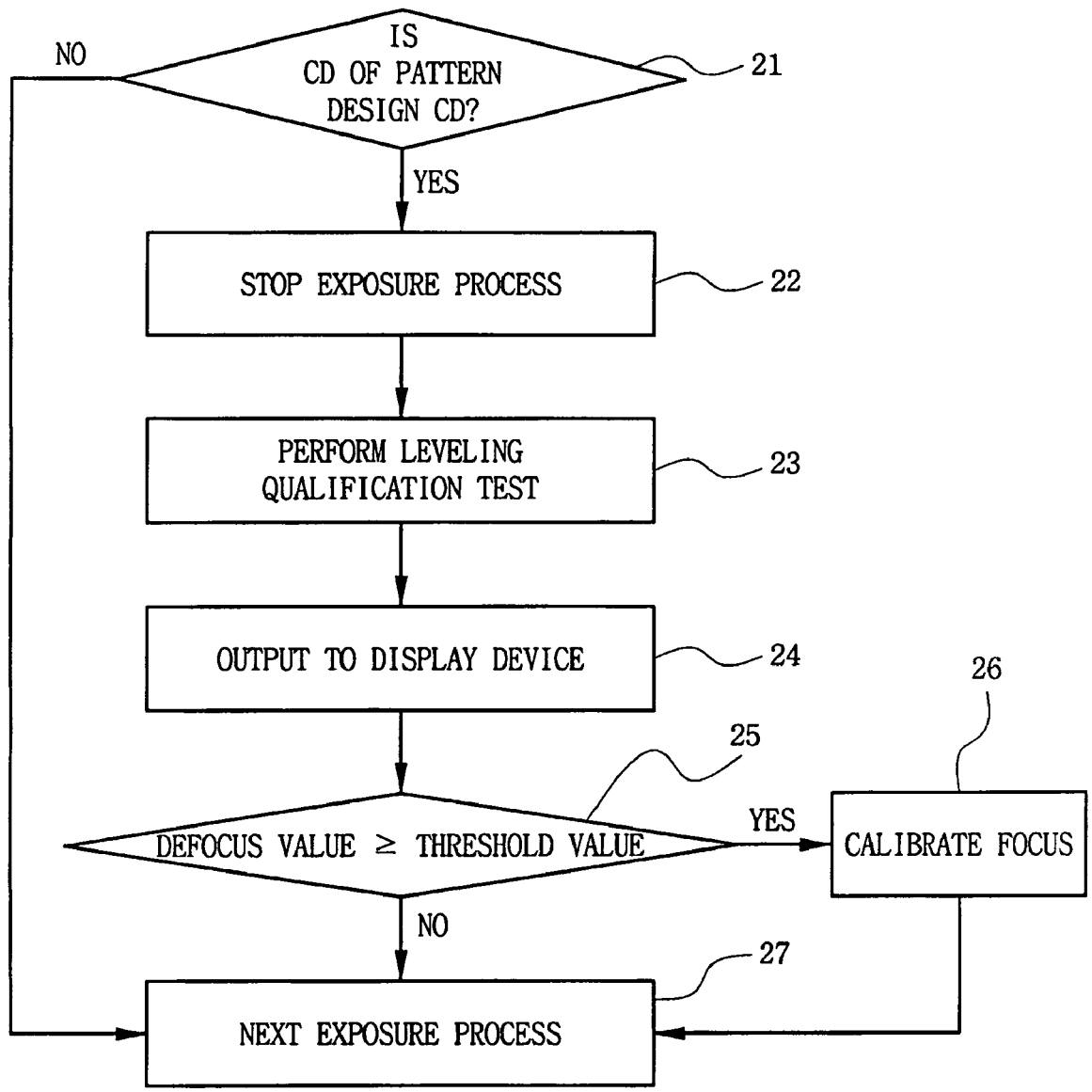
FIG. 2 is a flowchart of a prior art leveling qualification test using the leveling data shown in FIG. 1B.

The memory 101 stores leveling data for a wafer. The leveling data contains focus errors associated with a lens of the exposure apparatus. The leveling data may comprise conventional data of the type illustrated in FIG. 2. More specifically, the memory 101 may store all of the types of data illustrated in FIG. 2 (height data 12, inclination data 13 and progression of scan and focus error data 14), or memory 101 may only store progression of scan and focus error data 14. The memory 101 also stores a predetermined threshold value. This threshold value corresponds to an acceptable range for the focus of a lens during an exposure process in which the pattern of a reticle is transferred to a wafer, as will be described in more detail below.

Figure 1A:
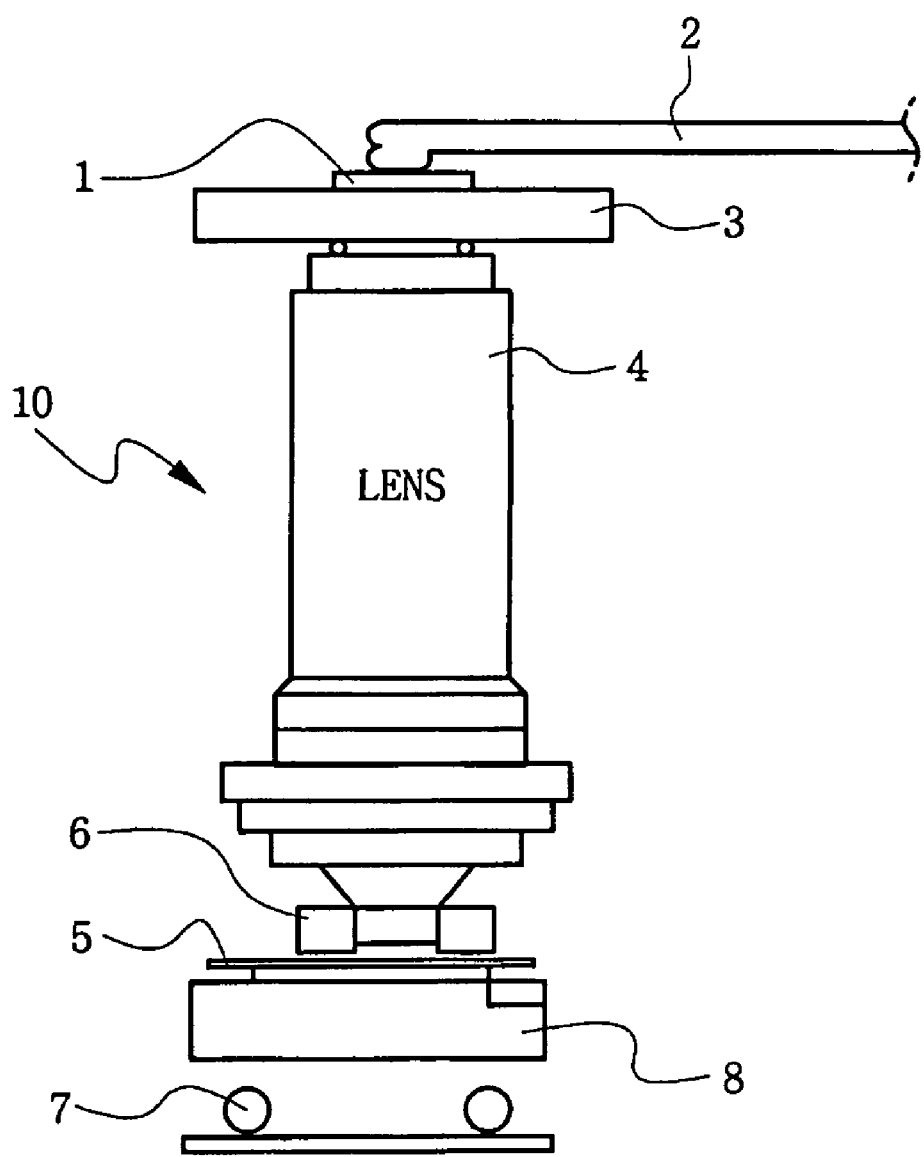
FIG. 1A is a sectional view of a prior art exposure apparatus for use in manufacturing a semiconductor device.

Interlock generator 102 generates an interlock signal if the exposure process is carried out at a focus outside of the acceptable range. Specifically, the interlock generator 102 computes the respective mean value for the up scan data and a mean value for the down scan data, e.g., for the data denoted by reference numeral 14 of FIG. 1B, computes the difference of the mean values, and produces a defocus value as the absolute value of the difference. Then, the interlock generator 102 compares the defocus value and the predetermined threshold value. Finally, the interlock generator 102 generates an interlock if the comparison reveals that the focus of the lens is outside of the acceptable range. The interlock signal is issued to the drive stop mechanism 130 which, upon receipt of the signal, shuts down the operation of the exposure apparatus.

The defocus value may be computed from the leveling data generated for a portion of a wafer, an entire wafer, or two or more wafers.

Figure 4:
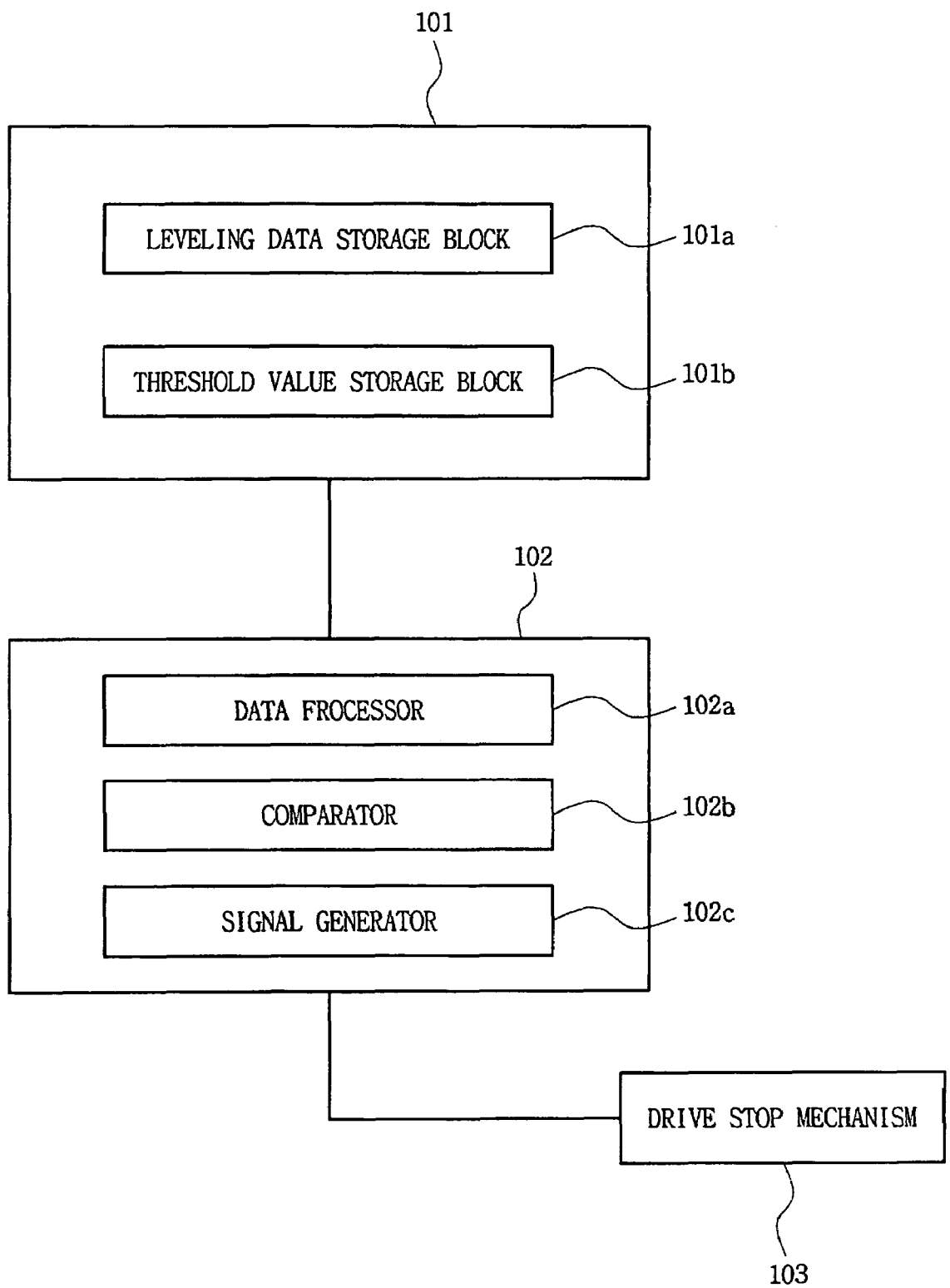
FIG. 4 is a more detailed block diagram of the electronic controls shown in FIG. 3.

Referring to FIG. 4, the memory 101 includes a data storage block 101a in which the leveling data is stored, and a threshold value storage block 101b in which a predetermined threshold value is stored. The interlock generator 102 includes a data processor 102a, a comparator 102b, and a signal generator 102c. The data processor 102a classifies the leveling data into up scan data and down scan data, computes the respective mean values of the up scan data and the down scan data, and computes a defocus value as the absolute value of the difference of the mean values. The comparator 102b compares the defocus value with the predetermined threshold value. The signal generator 102c selectively generates an interlock signal based the results of the comparison executed by the comparator 102b. The data processor 102a and comparator 102b may be constituted by a micro controller, for example.

Figure 5:
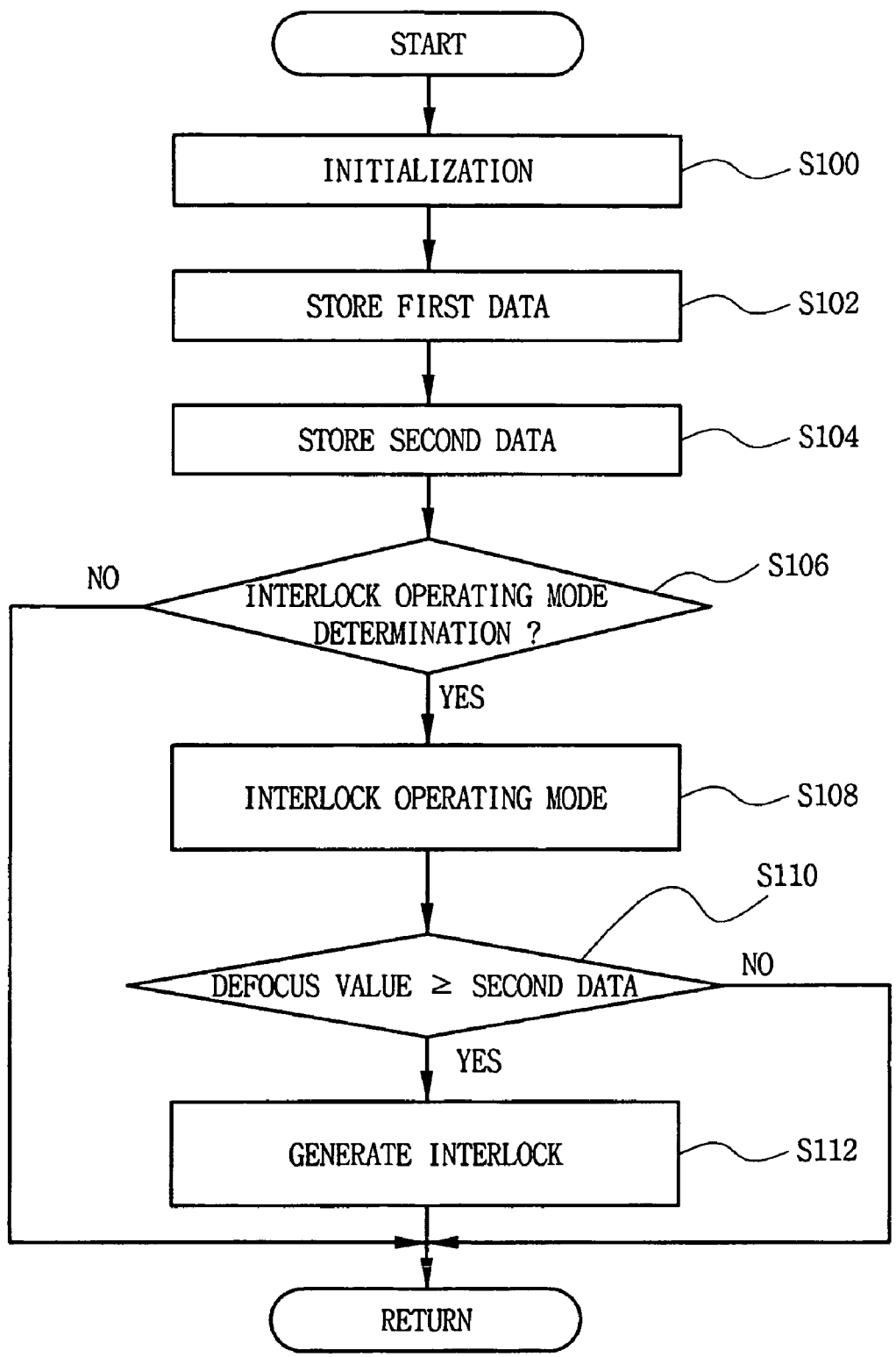
FIG. 5 is a flowchart of a method of controlling an exposure apparatus according to the present invention.

FIG. 5 is a flowchart illustrating a method in real-time for controlling an exposure apparatus using leveling data according to the present invention.

First, a detector of the exposure apparatus for detecting information by which the defocus of a lens can be determined is initialized (S100).

Leveling data (first data) generated by the detector is stored in the data storage block 101a of the memory 101 (S102), and a predetermined threshold value (second data) is also stored in the data storage block 101a (S104). The data (S102 and S104) may be stored in any sequence.

Next, an interlock operating mode determination is made (S106). Specifically, if an error occurs in the entry of data (S102) or (S104) or if the data storing block 101a has malfunctioned, the process restarts and the initialization (S100) is performed again. If there are no such errors or malfunctions, then the process proceeds in an interlock operating mode (S108).

In the interlock operating mode (S108), the leveling data is classified into up scan data and down scan data, the respective mean values of the up scan and down scan data are calculated, then a defocus value is computed as the absolute value of the difference of the mean values, and finally the defocus value is compared with the predetermined threshold value.

If the defocus value is below the predetermined threshold value in (S110), the process returns to the initialization step (S100). If the defocus value is equal to or greater than the threshold value, an interlock signal is generated (S112).

As described above, the present invention is capable of producing a value representative of the defocus of an exposure process in real time, and generating an interlock signal when the defocus is excessive. That is, defocus can be detected without stopping the exposure process and without performing a level qualification test. Also, the present invention makes it possible to minimize errors in an exposure process and thereby avoid the inconvenience of having to perform a level qualification test when a critical dimension of a circuit pattern on a wafer is greater than the desired critical dimension.

Finally, although the present invention has been described above in connection with the preferred embodiments thereof, the present invention is not so limited. Rather, various changes to and modifications of the preferred embodiments will be apparent to those skilled in the art. For instance, although the present invention has been described above with respect to an exposure apparatus comprising a scanner, the present invention may also be applied to an exposure apparatus comprising a stepper. Thus, all such changes and modifications are seen to be within the true spirit and scope of the invention as defined by the appended claims.

What is claimed is:

1. An exposure apparatus that performs an exposure process in which an image of a pattern is transferred to a substrate, said apparatus comprising:
    a light source that emits light;
    a lens positioned to transmit the emitted light and focus the light onto an image plane;
    a reticle or mask bearing the pattern an image of which is to be transferred to the substrate, the reticle or mask operatively interposed between said light source and said lens in the apparatus such that the image of the pattern is transmitted by the light through said lens; and
    electronic controls comprising a memory in which leveling data representing errors in the focus of the lens and a threshold value are stored, and
    an interlock generator including a data processor that calculates a defocus value, indicative of the defocus associated with the lens, from the leveling data, a comparator that compares the defocus value with the threshold value during the exposure process, and a signal generator that selectively generates an interlock signal based on the results of the comparison executed by the comparator.

2. The apparatus of claim 1, wherein the leveling data comprises up scan data representative of errors in the focus of the lens while a substrate is being scanned in one direction, and down scan data representative of errors in the focus of the lens while a substrate is being scanned in another direction opposite to said one direction.

3. The apparatus of claim 2, wherein the leveling data further comprises height data representative of the relative height of a surface of the substrate during an exposure process, and inclination data representative of the degree to which a surface of the substrate is inclined relative to the horizontal during an exposure process.

4. The apparatus of claim 2, wherein the data processor of the interlock generator is operative to classifying the leveling data into the up scan data and the down scan data, compute the respective mean values of the up scan data and the down scan data, and compute the difference of the mean values.

5. The apparatus of claim 1, wherein said electronic controls further comprise a drive stop mechanism electronically connected to said interlock signal generator so as to receive the interlock signal generated thereby, said drive stop mechanism being operative to stop an exposure process when the interlock signal is received.

6. The apparatus of claim 1, wherein the exposure apparatus comprises a scanner.

7. The apparatus of claim 1, wherein the exposure apparatus comprises a stepper.

8. A method of controlling an exposure apparatus that executes an exposure process in which an image is transferred to a substrate by light directed through a lens, the method comprising:
    while the exposure process is being performed on a substrate, comparing a defocus value with a threshold value, the defocus value being indicative of the defocus associated with the lens, and
    generating an interlock signal that stops the exposure process when said comparing yields a certain result.

9. The method of claim 8, and further comprising generating leveling data from at least one substrate undergoing the exposure process executed by the apparatus, and calculating the defocus value from the leveling data.

10. The method of claim 9, wherein the exposure process executed by the apparatus comprises scanning each of several portions of a substrate with the light.

11. The method of claim 10, wherein the leveling data comprises up scan data representative of errors in the focus of the lens while a substrate is being scanned in one direction, and down scan data representative of errors in the focus of the lens while a substrate is being scanned in another direction opposite to said one direction.

12. The method of claim 11, wherein the leveling data further comprises height data representative of the relative height of a surface of the substrate during an exposure process, and inclination data representative of the degree to which a surface of the substrate is inclined relative to the horizontal during an exposure process.

13. The method of claim 11, further comprising:
    classifying the leveling data into the up scan data and the down scan data,
    computing the respective mean values of the up scan data and the down scan data, and
    producing the defocus value by computing a difference of the mean values.

14. The method of claim 9, wherein the leveling data is generated from only one substrate undergoing the exposure process.

15. The method of claim 9, wherein the leveling data is generated from at least two substrates undergoing the exposure process.

16. A method of controlling an exposure apparatus that executes an exposure process in which an image is transferred to a substrate by light directed through a lens, the method comprising:

generating leveling data from at least one substrate undergoing the exposure process, the leveling data representative of errors in the focus of the lens during the exposure process;

storing the leveling data and storing a predetermined threshold value;

computing a defocus value, indicative of the defocus associated with the lens, from the leveling data;

while the exposure apparatus is executing an exposure process, comparing the defocus value with the threshold value to determine whether the focus of the lens is within an acceptable range;

generating an interlock signal when said comparing indicates that the focus of the lens is outside the acceptable range; and shutting down the operation of the exposure apparatus when the interlock signal is generated.

17. The method of claim 16, wherein the exposure process executed by the apparatus comprises scanning each of several portions of a substrate with the light.

18. The method of claim 17, wherein the leveling data comprises up scan data representative of errors in the focus of the lens while a substrate is being scanned in one direction, and down scan data representative of errors in the focus of the lens while a substrate is being scanned in another direction opposite to said one direction.

19. The method of claim 18, wherein said computing of the defocus value comprises:

classifying the leveling data into the up scan data and the down scan data, computing the respective mean values of the up scan data and the down scan data, and computing a difference of the mean values.

* * * * *